(12) United States Patent
Singer et al.

(10) Patent No.: US 6,836,530 B2
(45) Date of Patent: Dec. 28, 2004

(54) ILLUMINATION SYSTEM WITH A PLURALITY OF INDIVIDUAL GRATINGS

(75) Inventors: Wolfgang Singer, Aalen (DE); Markus Weiss, Aalen (DE); Bernd Kleemann, Aalen (DE); Karlfried Osterried, Aalen (DE); Johannes Wangler, Königsbronn (DE); Frank Melzer, Utzmemming (DE); Andreas Heisler, Steinheim (DE); Vadim Yevgenyevich Banine, Helmond (NL)

(73) Assignees: Carl Zeiss SMT AG, Oberkochen (DE); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/163,262

(22) Filed: Jun. 5, 2002

(65) Prior Publication Data

US 2003/0099040 A1 May 29, 2003

(30) Foreign Application Priority Data

Jun. 7, 2001 (DE) ........................................ 101 27 449

(51) Int. Cl.$^7$ ................................................ G21K 5/00
(52) U.S. Cl. ........................... 378/34; 378/35; 356/328; 250/504
(58) Field of Search ............................ 378/34, 35, 84, 378/85, 360; 359/570; 356/360, 328; 250/504, 504 R

(56) References Cited

U.S. PATENT DOCUMENTS

| | | | | |
|---|---|---|---|---|
| 4,798,446 A | * | 1/1989 | Hettrick | 359/570 |
| 4,915,463 A | * | 4/1990 | Barbee, Jr. | 359/360 |
| 5,905,571 A | * | 5/1999 | Butler et al. | 356/328 |
| 5,920,380 A | | 7/1999 | Sweatt | 355/77 |
| 2001/0006413 A1 | * | 7/2001 | Burghoorn | 355/53 |
| 2002/0105725 A1 | * | 8/2002 | Sweatt et al. | 359/566 |

FOREIGN PATENT DOCUMENTS

WO    WO 00/08526    2/2000

OTHER PUBLICATIONS

W. Ulrich, S Beiersdöfer, H.J. "*Trends in Optical Design of Projection Lenses for UV and EUV Lithography*" in Soft X–Ray and EUV Imaging Systems, W.M Kaiser, R.H. Stulen, Proceedins of SPIE, vol. 4146 (2000) pp. 13–24.

M. Antoni, W. Singer, J. Schultz, J. Wangler, I. Escudero–Sanz, B. Kruizinga, "*Illumination Optics Design for EUV Lithography*" in Soft X–Ray and EUV Imaging Systems. W M Kaiser. R H Stulen, Proceedings of SPIE. vol. 4146 pp. 25–34.

H. Petersen, C. Jung, C. Hellwig, W.B. Peatmen, W. Gudat "*Review of plane grating focusing for soft x–ray monochromators*", Rev. Sci. Instrum. 66(1). Jan. 1995.

M.V.R.K. Murty "*Use of convergent and divergent illumination with plane gratings*", Journal of the Optical Society of America, vol. 52. No. 7, Jul. 1962, pp. 768–773.

T. Oshio. E Ishiguro. R Iwanaga: "*A theory of new astigmatism and coma–free spectrometer*". Nuclear Instruments and Methods 208 (1993) 297–301.

"*Lexicon of Optics*" published by Hans Hagerborn. pp 48–49.

"*Lexicon of Optics*" in two vo:umes pp 77–80.

H. Raul Beguiristain. "*Thermal Distortion Effects on Optical Subtrates that Reduce Coherence Properties of Undulator Beam Lines*".

\* cited by examiner

Primary Examiner—Craig E. Church
Assistant Examiner—Irakli Kiknadze
(74) Attorney, Agent, or Firm—Ohlandt, Greeley, Ruggiero & Perle, LLP

(57) ABSTRACT

There is provided an illumination system for wavelengths of ≦100 nm, having an object plane and a field plane. The illumination system includes a grating element having a plurality of gratings, and a diaphragm. The diaphragm is arranged after the grating element in a beam path from the object plane to the field plane.

46 Claims, 7 Drawing Sheets

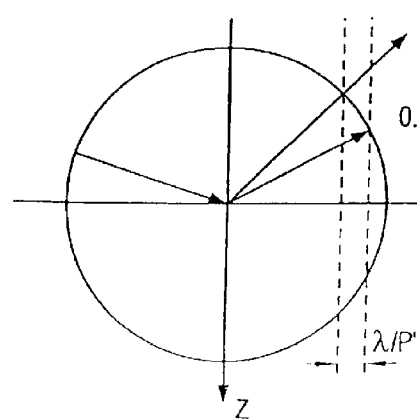
Fig. 6a
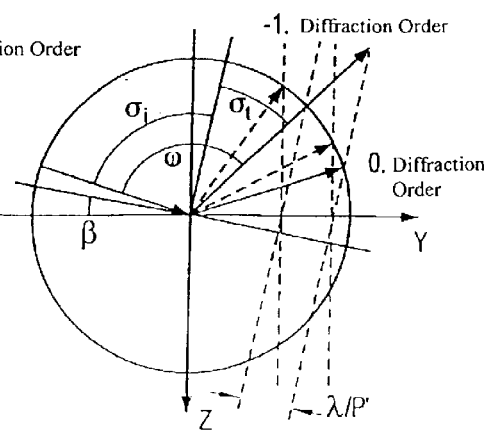
Fig. 6b
Fig. 6c
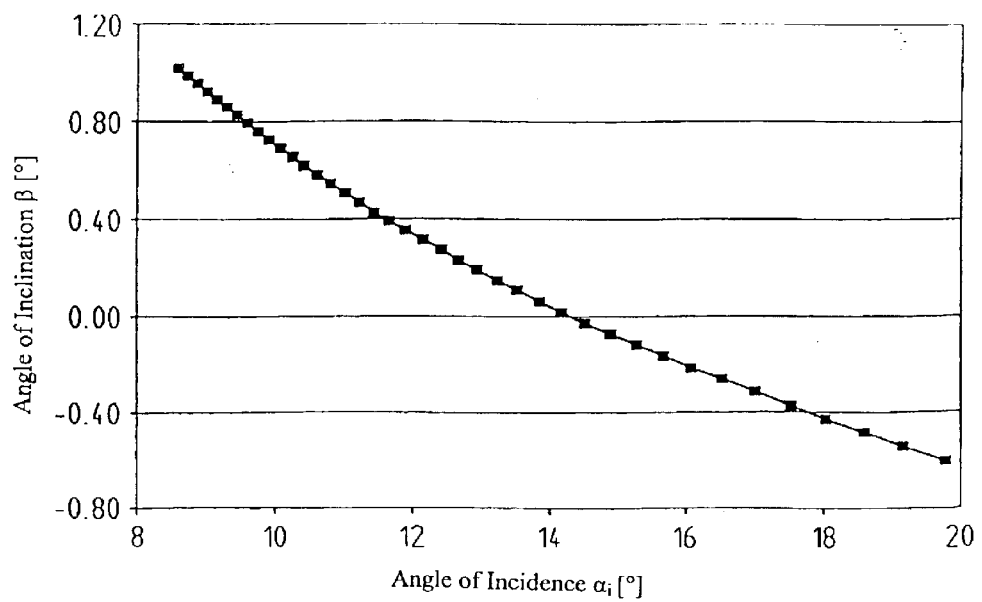

ILLUMINATION SYSTEM WITH A PLURALITY OF INDIVIDUAL GRATINGS

CROSS REFERENCE TO RELATED APPLICATIONS

The present application is claiming priority of German Patent Application Serial No. 101 27 449. 1, which was filed on Jun. 7, 2001.

BACKGROUND OF THE INVENTION

1. Field of the Invention

The invention concerns an illumination system for wavelengths of $\leq 100$ nm, wherein the illumination system has an object plane and a field plane.

2. Description of the Prior Art

In order to allow for further reduction in the structural widths of electronic components, especially in the submicron range, it is necessary to shorten the wavelength of the light used for microlithography. It is conceivable to use light with wavelengths of less than 100 nm, for example, lithography with soft x-rays, so-called EUV lithography.

EUV lithography is one of the most promising future lithography techniques. At present, wavelengths in the range of 11–14 nm, especially 13.5 nm, are being considered as wavelengths for EUV lithography, with a numerical aperture of 0.2–0.3. The image quality in EUV lithography is determined, on the one hand, by the projection objective, and, on the other hand, by the illumination system. The illumination system should provide the most uniform possible illumination of the field plane, in which the pattern-bearing mask, the so-called reticle, is situated. The projection objective images the field plane in an image plane, the so-called wafer plane, in which a light-sensitive object is arranged. Projection illumination systems for EUV lithography are designed with reflective optical elements. The form of the field of an EUV projection illumination system is typically that of an annular field with a high aspect ratio of 2 mm (width)×22–26 mm (arc length). The projection systems usually operate in scanning mode. Regarding EUV projection illumination systems, reference is made to the following publications:

W. Ulrich, S. Beiersdörfer, H. J. Mann, "Trends in Optical Design of Projection Lenses for UV and EUV Lithography" in Soft X-Ray and EUV Imaging Systems, W. M. Kaiser, R. H. Stulen (Publisher), Proceedings of SPIE, Vol. 4146 (2000), pages 13–24, and M. Antoni, W. Singer, J. Schultz, J. Wangler, I. Escudero-Sanz, B. Kruizinga, "Illumination Optics Design for EUV Lithography" in Soft X-Ray and EUV Imaging Systems, W. M. Kaiser, R. H. Stulen (Publisher), Proceedings of SPIE, Vol. 4146 (2000), pages 25–34, whose disclosure content is incorporated to the full extent in the present application.

In illumination systems for wavelengths of $\leq 100$ nm, a problem arises in that a light source of such illumination system emits radiation of wavelengths that can lead to an unwanted exposure of the light-sensitive object in the wafer plane of the projection exposure system and, moreover, optical components of the exposure system, such as multi-layer mirrors, are heated by such radiation.

In order to filter out radiation of unwanted wavelengths, transmission filters, made for example from zirconium, are used in illumination systems for wavelengths of $\leq 100$ nm. Such filters have the disadvantage of large losses of light. Furthermore, they can be very easily disrupted by thermal stress.

SUMMARY OF THE INVENTION

The object of the invention is to provide an illumination system for wavelengths of $\leq 100$ nm, especially in the EUV range, in which it is possible to avoid the aforesaid drawbacks and disadvantages. Furthermore, the components of such an illumination system should be simple in construction and manufacture.

According to the invention, this object is solved by an illumination system that has at least one grating element, which has a plurality of individual gratings with a grating period assigned to the individual gratings, and with at least one diaphragm in a diaphragm plane, which is arranged after the grating element in a beam path from an object plane to a field plane.

Grating elements, such as reflection gratings, in particular echelette gratings with an overall efficiency near 60%, are already known for some time from the design of monochromators for synchrotron radiation sources, and there is good experience available, especially even with very high fluxes.

The behavior of diffraction gratings is described by the grating equation $$n\frac{\lambda}{p} = \cos\alpha_t - \cos\alpha_i$$

with a grating period p, a diffraction order n, an angle of incidence $\alpha_i$ relative to a surface tangent, an angle of diffraction $\alpha_t$ relative to the surface tangent, and a wavelength $\lambda$.

When considering convergent or divergent radiation, it is necessary to consider an optical effect of the grating.

Regarding the use of diffraction gratings in monochromators, reference is made to the following publications, whose disclosure contents are fully incorporated in the present application:

H. Petersen, C. Jung, C. Hellwig, W. B. Peatman, W. Gudat: "Review of plane grating focusing for soft x-ray monochromators", Rev. Sci. Instrum. 66(1), January 1995

M. V. R. K. Murty: "Use of convergent and divergent illumination with plane gratings", Journal of the Optical Society of America, Vol. 52, No. 7, July 1962, pp. 768–773

T. Oshio, E. Ishiguro, R. Iwanaga: "A theory of new astigmatism and coma-free spectrometer, Nuclear Instruments and Methods 208 (1993) 297–301

The inventors have discovered for the first time that a grating element can be used in a beam path from an object plane to an image plane for spectral filtering in an illumination system for wavelengths of $\leq 100$ nm when individual diffraction orders and wavelengths are distinctly separate from each other.

The separation of the different diffraction orders is simple in a focused beam. In a focused beam at a focal point there is a focus or image of a light source with limited diameter. However, one needs to select a certain aperture for the focused beam, so as not to get excessively long structural lengths of the illumination system. On the other hand if the one selects a high aperture, the grating design is more difficult, or one gets larger aberrations.

To achieve separation of the individual diffraction orders the grating element is of complicated construction, for example, with a continuously varying grating constant or an arrangement on a curved surface. A substantial effort is required to produce such gratings.

The inventors have recognized that a separation of the individual diffraction orders and sufficient imaging quality can also be achieved if one uses a plurality of individual gratings, instead of a grating element with continuously changing grating constant, for example.

Preferably the individual gratings are arranged either one on top of another or one behind the other in a direction of an impinging beam. The individual gratings in a first embodiment of the invention can be gratings with different grating periods.

In an alternative embodiment, individual gratings are arranged tilted relative to each other.

When the individual gratings are arranged one after the other, cooling devices can be provided at a side facing away from the impinging beams. In this manner, it is possible to prevent undesirable heating of the grating.

The individual gratings are preferably designed as Blaze gratings, which are optimized for maximum efficiency in one diffraction order. Blaze gratings are known, for example, from the Lexicon of Optics, published by Heinz Hagerborn, pages 48–49. They are distinguished by an approximately triangular groove form of the grating.

As already mentioned, the different diffraction orders and wavelengths can be distinctly separated from each other with the grating element according to the invention.

The at least one diaphragm according to the invention serves to prevent stray light with wavelengths far above 100 nm from getting into the illumination system via the $0^{th}$ diffraction order. The at least one diaphragm basically blocks the light of the $0^{th}$ diffraction order.

It is especially preferable for rays after the diaphragm to have wavelengths in the region of 7 to 25 nm, by a combination of grating and a diaphragm.

Advantageously, the illumination system includes a collector unit to generate a convergent bundle of light and the convergent light bundle, sometimes referred to as a beam bundle, impinges on the grating element.

Especially preferred, a focus of the light bundle of the $n^{th}$ diffraction order, where $|n| \geq 1$, of the grating element will come to lie at a site of the diaphragm or in a vicinity of the diaphragm, In order to avoid an excessive thermal load on the diaphragm in a diaphragm plane or on optical elements that come after it, a portion of radiation of unwanted wavelengths can be filtered out by additional diaphragms in the illumination system.

Besides the illumination system, the invention also provides a projection exposure system with such an illumination system, as well as a method for the production of microelectronic components.

BRIEF DESCRIPTION OF THE DRAWINGS

The invention shall be described hereafter by an example, using the drawings.

These show:

FIG. 6C Angle of inclination of the individual gratings as a function of the angle of incidence FIG. 7 Spot diagram in the diaphragm plane of the illumination system with a grating element having linear gratings of different inclination FIG. 8 Blaze grating FIG. 9 Grating element with linear gratings arranged one above the other FIG. 10 Maximum possible diffraction efficiency for grating elements consisting of various materials, configured as Blaze gratings FIG. 11 EUV projection exposure system with an illumination system according to the invention.

DESCRIPTION OF THE INVENTION

Figure 1:
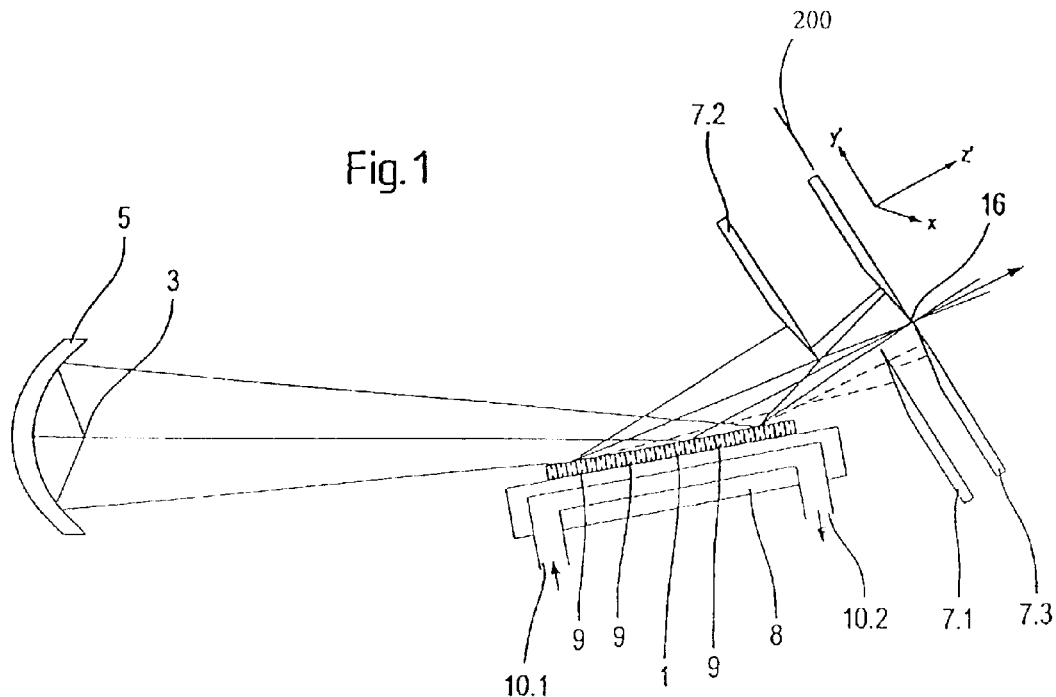
FIG. 1 Arrangement of a grating element with individual gratings and diaphragm arranged one after the other in the beam path of the collector unit of an illumination system FIG. 2 Grating element with reference symbols to derive the grating period as a function of the angle of incidence or to derive the tilt angle FIG. 3 Grating period of individual gratings as a function of the angle of incidence FIG. 4A Spot diagram in the diaphragm plane of the illumination system with 21 linear gratings of different grating period, arranged one after the other FIG. 4B Spot diagram in the diaphragm plane of the illumination system with 31 linear gratings of different grating period, arranged one after the other FIG. 5 Grating element with 40 linear gratings inclined relative to the plane of incidence FIGS. 6A And 6B Laue construction for calculating the angle of inclination of a grating according to FIG. 5

FIG. 1 shows a grating element 1 with a plurality of individual gratings 9 in a beam path of an illumination system. Individual gratings 9 are arranged one after the other in the beam direction. Light from a light source 3 is gathered by a collecting component, a collector 5. Collector 5 in this example is an ellipsoidal mirror, which produces an image of light source 3. A collimated light bundle with an aperture of around NA=0.1 is deflected in grazing incidence by grating element 1 after collector 5 so that an intermediate image of light source 3 comes to lie in or near a diaphragm plane 200 of a physical diaphragm, i.e., diaphragm 7.3.

By use of further physical diaphragms, i.e., diaphragms 7.1 and 7.2, arranged in front of diaphragm 7.3, a part of the unwanted radiation can be filtered out in order to reduce the heat load on diaphragm 7.3. Diaphragm 7.3 in one embodiment can have a circular opening. Diaphragm 7.3 is situated in a focal plane of a desired diffraction order, here, the −1 order (reference numeral 16). Further diaphragms 7.1, 7.2 can be additionally cooled, which is not depicted. Grating element 1 can also be cooled, for example, by a cooling on its backside. A backside cooling device 8 is preferably a liquid cooling device with an inlet 10.1 and an outlet 10.2. With grating element 1 and diaphragm 7.3, it is possible to totally block the $0^{th}$ order, which comprises all wavelengths of light source 3 in an illumination system according to the invention. Furthermore, all higher orders except the −1 order are also blocked.

Discrete grating periods for an arrangement of individual gratings 9 arranged one after the other according to the invention shall now be given below.

For the derivation, we shall resort to reflective imaging optics, wherein the optics will image light from a virtual intermediate image, corresponding to the $0^{th}$ order, in an actual image, corresponding to the +1 or −1 order. A solution is then given by a hyperboloid.

A grating element designed in a plane must thus have grating grooves, in an ideal case, that are given by points of intersection of a hyperbolic family of curves with this plane, the family of curves being defined by hyperbolas, which have a light path difference of $n\pi$ for a point-to-point image between a focal point without a mirror and the $n^{th}$ order.

The inventors have discovered that, under grazing incidence, this grating element with optical effect can be resolved sufficiently well by an array of individual gratings arranged one after the other or above the other, without the imaging quality of the illumination system being unacceptably impaired.

Figure 2:
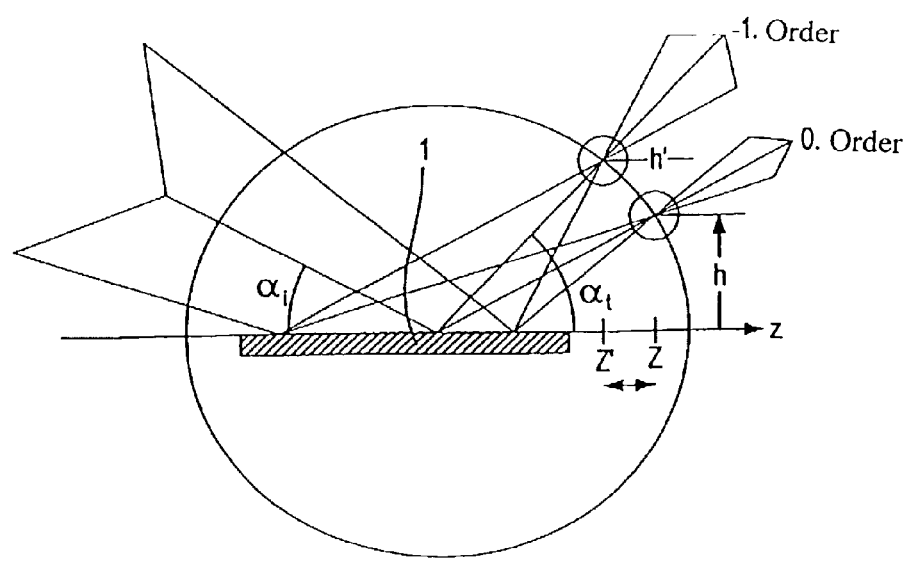

Parameters used for a formal derivation of a grating element according to the invention are given in FIG. 2.

Here:

$\alpha_i$: is the angle at which the light beam impinges on the grating element, $\alpha_t$: is the angle at which the beam is diffracted by the grating element, and h, h': are the heights of the image loci.

A particular beam, which impinges on grating element 1 at the angle $\alpha_i$, is reflected at angle $\alpha_t$ in the $0^{th}$ diffraction order. The first diffraction order for this beam needs to be far enough away that a separation of the diffraction orders is possible taking into consideration the diameter of the image of light source 3 at the focal point. It is then possible, by an arrangement of diaphragm 7.3 in the plane where the focal point comes to lie, to completely block the $0^{th}$ diffraction order, which comprises all wavelengths.

The beam angle of the first diffraction order relative to the grating surface, i.e., angle $\alpha_t$, must be respectively larger or smaller than angle $\alpha_i$ by $\Delta\alpha$, where:

$$\Delta\alpha > 2\arctan\left(\frac{D}{2l}\right) \tag{1}$$

wherein:

D: is the distance of a desired diffraction order from the $0^{th}$ diffraction order in a filter plane l: is the distance between a locus of reflection on a mirror with grating and an image point.

For a central ray, hereinafter termed the chief ray, let an angle of incidence be $\alpha_i(0)$. From this, we can determine the heights h and h' of image loci. Likewise, z-coordinates of the image loci can be calculated relative to a ray intersection point of the chief ray with the mirror:

$$h = l_0 \sin \alpha_i(0) \tag{2}$$

$$h' = l_0 \sin \alpha_t(0) = l_0 \sin(\alpha_i(0)+\Delta\alpha) \tag{3}$$

$$z = l_0 \cos \alpha_i(0) \tag{4}$$

$$z' = l_0 \cos \alpha_t(0) = l_0 \cos(\alpha_i(0)+\Delta\alpha) \Rightarrow dz = z - z' \tag{5}$$

Now, for every other beam, designated by its angle $\alpha_i$, it is possible to determine a length to the $0^{th}$ order $l(\alpha_i)$ and a length to the $1^{st}$ order $l'(\alpha_i)$, as well as a new z-coordinate $z'(\alpha_i) = z(\alpha_i) - dz$, wherein $h'(\alpha_i) = h' = \text{const}$. From the quantities $l'(\alpha_i)$ and $z'(\alpha_i)$, a local diffraction angle $\alpha_t(\alpha_i)$ is determined as:

$$\alpha_t(\alpha_i) = \arccos\left(\frac{z'(\alpha_i)}{l'(\alpha_i)}\right) \tag{6}$$

and there follows for the local grating period P:

$$P = \frac{\lambda}{\cos\alpha_i - \cos\alpha_t(\alpha_i)} \tag{7}$$

We shall now give two examples of embodiments of grating spectral filters with individual gratings arranged one after the other, with a grating period being different for the individual gratings. An arrangement of the individual gratings in a plane is especially advantageous for cooling the grating, since the grating can be provided with a cooling gradient on its backside, for example, cooling channels. The values for $\alpha_i$, $\alpha_t$, the grating period, a starting value and an ending value along the z-axis, and a Blaze depth of a grating element produced from individual gratings arranged one after the other will be found in Tables 1 and 2. Regarding a definition of the Blaze depth, refer to FIG. 8 in the following description.

Table 1 shows an example of an embodiment for 21 linear gratings.

Table 2 shows an example of an embodiment for 31 linear gratings.

The following parameters are given:

| | |
|---|---|
| Distance of the −1 diffraction order from the $0^{th}$ diffraction order in a diaphragm plane | D = 10 mm |
| Distance from grating to focal point of the chief ray | $l_0$ = 380 mm |
| Numerical aperture of the light bundle | NA = 0.1 |
| Maximum reflection angle | $\alpha_{max}$ < 200 |
| Minimum grating period | p > 1 μm |
| Diffraction order | n = −1 |

The individual gratings are designed as so-called Blaze gratings, i.e., they are optimized for maximum efficiency in the desired diffraction order. This is achieved approximately by a triangular groove profile. An ideal Blaze depth B in a scalar approximation is calculated by $$B = \frac{|n|\lambda}{\sin\alpha_t + \sin\alpha_i} \tag{8}$$

Table 1:

21 grating segments made from individual gratings, which are arranged one after the other in a plane, together yield a spectral filter. Starting and ending positions of the gratings in terms of a point of incidence of a chief ray with a surface in which the gratings lie are given.

TABLE 1

| Grating | $\alpha_i$ ° | $\alpha_t$ ° | Period μm | z-start mm | z-end mm | Blaze depth μm |
|---|---|---|---|---|---|---|
| 0 | 20.00 | 22.08 | 1.03 | 115.23 | 107.22 | 0.019 |
| 1 | 19.43 | 21.45 | 1.09 | 107.22 | 98.76 | 0.019 |
| 2 | 18.85 | 20.82 | 1.15 | 98.76 | 89.80 | 0.020 |
| 3 | 18.28 | 20.19 | 1.22 | 89.80 | 80.29 | 0.020 |
| 4 | 17.70 | 19.56 | 1.29 | 80.29 | 70.17 | 0.021 |
| 5 | 17.13 | 18.93 | 1.38 | 70.17 | 59.39 | 0.022 |
| 6 | 16.56 | 18.30 | 1.47 | 59.39 | 47.87 | 0.022 |
| 7 | 15.98 | 17.67 | 1.58 | 47.87 | 35.54 | 0.023 |
| 8 | 15.41 | 17.03 | 1.69 | 35.54 | 22.30 | 0.024 |
| 9 | 14.83 | 16.40 | 1.82 | 22.30 | 8.04 | 0.025 |
| 10 | 14.26 | 15.77 | 1.97 | 8.04 | −7.35 | 0.026 |
| 11 | 13.69 | 15.14 | 2.13 | −7.35 | −24.03 | 0.027 |
| 12 | 13.11 | 14.50 | 2.23 | −24.03 | −42.17 | 0.028 |
| 13 | 12.54 | 13.87 | 2.53 | −42.17 | −61.97 | 0.029 |
| 14 | 11.97 | 13.23 | 2.77 | −61.97 | −83.67 | 0.031 |
| 15 | 11.39 | 12.60 | 3.06 | −83.67 | −107.57 | 0.032 |
| 16 | 10.82 | 11.96 | 3.39 | −107.57 | −134.01 | 0.034 |
| 17 | 10.24 | 11.33 | 3.78 | −134.01 | −163.44 | 0.036 |
| 18 | 9.67 | 10.69 | 4.24 | −163.44 | −196.40 | 0.038 |
| 19 | 9.10 | 10.06 | 4.79 | −196.40 | −233.56 | 0.040 |
| 20 | 8.52 | 9.42 | 5.45 | −233.56 | −275.78 | 0.043 |

Table 2

31 grating segments made from individual gratings, which are arranged one after the other in a plane, together yield a spectral filter. Starting and ending positions of the gratings in terms of a point of incidence of a chief ray with a surface in which the gratings lie are given.

TABLE 2

| Grating | $\alpha_i$ ° | $\alpha_t$ ° | Period μm | z-start mm | z-end mm | Blaze depth μm |
|---|---|---|---|---|---|---|
| 0 | 20.00 | 22.08 | 1.03 | 113.83 | 108.49 | 0.019 |
| 1 | 19.62 | 21.66 | 1.07 | 108.49 | 102.95 | 0.019 |

TABLE 2-continued

| Grating | $\alpha_i$ ° | $\alpha_t$ ° | Period μm | z-start mm | z-end mm | Blaze depth μm |
|---|---|---|---|---|---|---|
| 2 | 19.23 | 21.24 | 1.11 | 102.95 | 97.19 | 0.020 |
| 3 | 18.85 | 20.82 | 1.15 | 97.19 | 91.21 | 0.020 |
| 4 | 18.47 | 20.40 | 1.20 | 91.21 | 84.99 | 0.020 |
| 5 | 18.09 | 19.98 | 1.24 | 84.99 | 78.51 | 0.021 |
| 6 | 17.70 | 19.56 | 1.29 | 78.51 | 71.75 | 0.021 |
| 7 | 17.32 | 19.14 | 1.35 | 71.75 | 64.71 | 0.022 |
| 8 | 16.94 | 18.72 | 1.41 | 64.71 | 57.35 | 0.022 |
| 9 | 16.56 | 18.30 | 1.47 | 57.35 | 49.66 | 0.023 |
| 10 | 16.17 | 17.88 | 1.54 | 49.66 | 41.62 | 0.023 |
| 11 | 15.79 | 17.46 | 1.61 | 41.62 | 33.19 | 0.024 |
| 12 | 15.41 | 17.03 | 1.69 | 33.19 | 24.34 | 0.024 |
| 13 | 15.03 | 16.61 | 1.78 | 24.34 | 15.06 | 0.025 |
| 14 | 14.64 | 16.19 | 1.87 | 15.06 | 5.29 | 0.025 |
| 15 | 14.26 | 15.77 | 1.97 | 5.29 | −5.00 | 0.026 |
| 16 | 13.88 | 15.35 | 2.07 | −5.00 | −15.84 | 0.027 |
| 17 | 13.50 | 14.92 | 2.19 | −15.84 | −27.30 | 0.027 |
| 18 | 13.11 | 14.50 | 2.32 | −27.30 | −39.42 | 0.028 |
| 19 | 12.73 | 14.08 | 2.46 | −39.42 | −52.27 | 0.029 |
| 20 | 12.35 | 13.66 | 2.61 | −52.27 | −65.91 | 0.030 |
| 21 | 11.97 | 13.23 | 2.77 | −65.91 | −80.42 | 0.031 |
| 22 | 11.58 | 12.81 | 2.96 | −80.42 | −95.89 | 0.032 |
| 23 | 11.20 | 12.39 | 3.16 | −95.89 | −112.42 | 0.033 |
| 24 | 10.82 | 11.96 | 3.39 | −112.42 | −130.12 | 0.034 |
| 25 | 1.43 | 11.54 | 3.64 | −130.12 | −149.12 | 0.035 |
| 26 | 10.05 | 11.12 | 3.92 | −149.12 | −169.57 | 0.037 |
| 27 | 9.67 | 10.69 | 4.24 | −169.57 | −191.65 | 0.038 |
| 28 | 9.29 | 10.27 | 4.59 | −191.65 | −215.56 | 0.040 |
| 29 | 8.90 | 9.85 | 4.99 | −215.56 | −241.54 | 0.041 |
| 30 | 8.52 | 9.42 | 5.45 | −241.54 | −269.88 | 0.043 |

Figure 3:
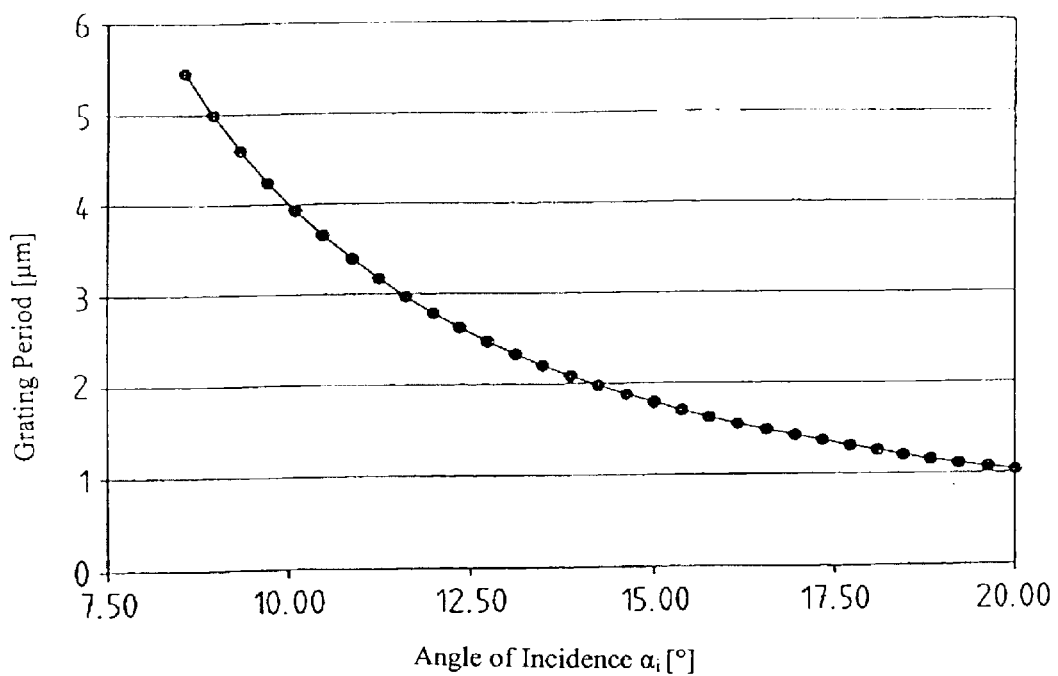

FIG. 3 shows a grating period of individual gratings as a function of an angle of incidence $\alpha_i$. The points reflect discrete values of the example of the embodiment with 31 individual gratings according to Table 2.

Figure 4A:
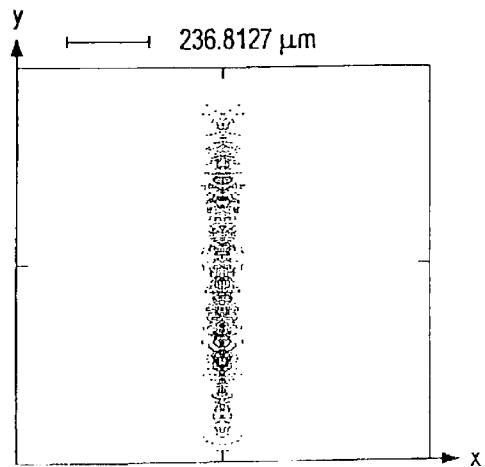
Figure 4B:
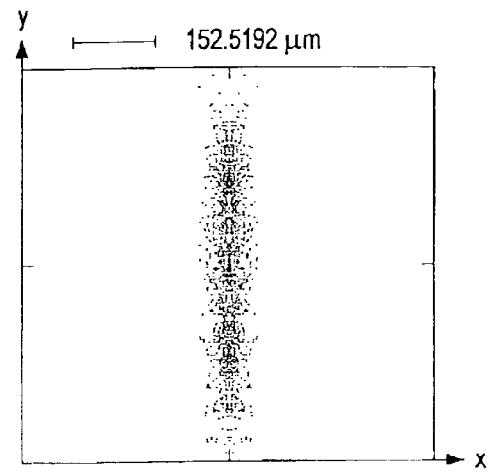

FIGS. 4A and 4B show spot diagrams of a point image of the −1 diffraction order for a design wavelength of 13.5 nm in a diaphragm plane, FIG. 4A with 21 and FIG. 4B with 31 individual gratings. The discrete nature of the grating element is made evident by a slight wash-out in the y-direction, but this is negligibly small, especially for N>30 gratings with <±0.5 mm; the image of the light source is washed out by this amount in the y-direction. The scale indicated in FIGS. 4A and 4B pertains to the scaling in both the x and the y directions.

In order to reduce manufacturing expense, in another embodiment of the invention it is proposed to have identically configured grating segments, but to incline these with an angle of tilt so that a desired diffraction order is pointed in a target direction. In this way, in the simplest case, one can put a spectral filter together from an array of identical individual gratings.

Figure 5:
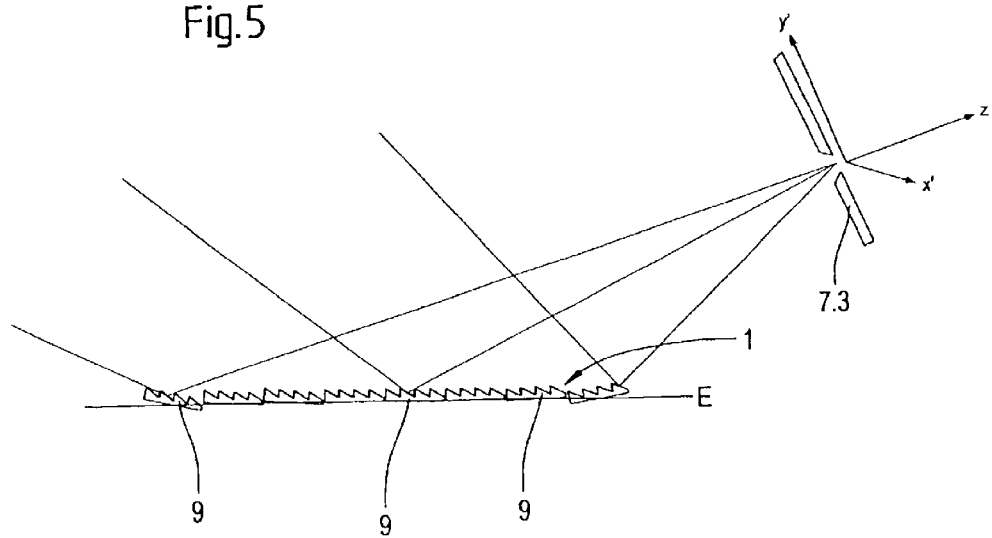

FIG. 5 shows such a grating element. Grating element 1 comprises a plurality of individual gratings 9 inclined against a plane of incidence E.

In order to compute an angle of inclination of an individual grating 9 with a constant grating period, one can use the Laue construction shown in FIGS. 6A and 6B. The reference symbols used hereafter can be found in these drawings.

With the known angle $$\omega = 180° - \alpha_i - \alpha_t = \sigma_i + \sigma_t \quad (9)$$

it follows for the angle of inclination β:

$$\beta = \alpha_i + \sigma_i - 90° \quad (10)$$

The angles $\sigma_i$ and $\sigma_t$ are associated by the Laue equation to the grating period P in the following manner:

$$\sin\sigma_i - \sin\sigma_t = \frac{\lambda}{P} \quad (11)$$

Solving equation (11) with (9) in terms of $\sigma_i$ yields $$\sin\sigma_i = \frac{-b + \sqrt{b^2 - 4ac}}{2a} \quad (12)$$

wherein:

$$a = 2(1 + \cos\omega)$$

$$b = -2\frac{\lambda}{P}(1 + \cos\omega)$$

$$c = \frac{\lambda^2}{P^2} - \sin^2\omega$$

In this manner, the angles of inclination β of the individual gratings can be calculated. Table 3 contains an of example an embodiment with 40 individual gratings, the following parameters being given:

| | |
|---|---|
| Distance of the −1 diffraction order from the 0th diffraction order in a diaphragm plane | D = 14 mm |
| Distance from grating to focal point of the chief ray | $l_0$ = 412 mm |
| Numerical aperture of the beam bundle | NA = 0.1 |
| Maximum reflection angle | $\alpha_{max}$ < 20° |
| Diffraction order | n = −1 |

Table 3: Angles of inclination of the grating element with 40 individual gratings.

Grating period: 1.5007 μm

TABLE 3

| Period Grating | 1.5007 Position [mm] | μm β [°] |
|---|---|---|
| 0 | −273.03 | 1.018 |
| 1 | −263.03 | 0.986 |
| 2 | −253.03 | 0.953 |
| 3 | −243.03 | 0.921 |
| 4 | −233.03 | 0.888 |
| 5 | −223.03 | 0.855 |
| 6 | −213.03 | 0.821 |
| 7 | −203.03 | 0.787 |
| 8 | −193.03 | 0.753 |
| 9 | −183.03 | 0.719 |
| 10 | −173.03 | 0.684 |
| 11 | −163.03 | 0.648 |
| 12 | −153.03 | 0.613 |
| 13 | −143.03 | 0.577 |
| 14 | −133.03 | 0.540 |
| 15 | −123.03 | 0.503 |
| 16 | −113.03 | 0.466 |
| 17 | −103.03 | 0.428 |
| 18 | −93.03 | 0.390 |
| 19 | −83.03 | 0.351 |
| 20 | −73.03 | 0.311 |
| 21 | −63.03 | 0.271 |
| 22 | −53.03 | 0.230 |
| 23 | −43.03 | 0.188 |
| 24 | −33.03 | 0.146 |
| 25 | −23.03 | 0.103 |
| 26 | −13.03 | 0.059 |
| 27 | −3.03 | 0.014 |

TABLE 3-continued

| Period Grating | 1.5007 Position [mm] | μm β [°] |
|---|---|---|
| 28 | 6.97 | −0.032 |
| 29 | 16.97 | −0.079 |
| 30 | 26.97 | −0.127 |
| 31 | 36.97 | −0.176 |
| 32 | 46.97 | −0.226 |
| 33 | 56.97 | −0.277 |
| 34 | 66.97 | −0.330 |
| 35 | 76.97 | −0.384 |
| 36 | 86.97 | −0.439 |
| 37 | 96.97 | −0.497 |
| 38 | 106.97 | −0.555 |
| 39 | 116.97 | −0.616 |

FIG. 6C shows the inclination angle β of the individual gratings as a function of the angle of incidence $\alpha_i$. The points reflect the discrete points of the example of embodiment with 40 individual gratings according to Table 3.

Figure 7:
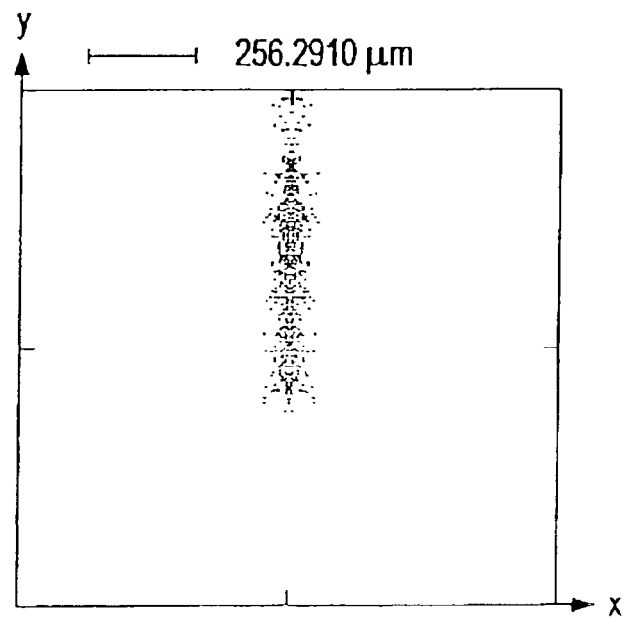

FIG. 7 shows a spot diagram of a point image of the −1 diffraction order in the diaphragm plane. The discrete nature of the grating element is made evident by a slight washout in the y-direction, but this is negligibly small with ≦±0.5 mm; the image of the light source is washed out by this amount in the y-direction. The scale indicated in FIG. 7 pertains to the scaling both in the x and the y directions.

With the grating spectral filters according to the examples of embodiment in Table 1, Table 2 and Table 3, wavelengths greater than approximately 17 nm can be almost totally filtered out. Wavelengths less than this are only partly filtered. By the invention the heat load on the mirrors of a projection system can be clearly reduced.

Figure 9:
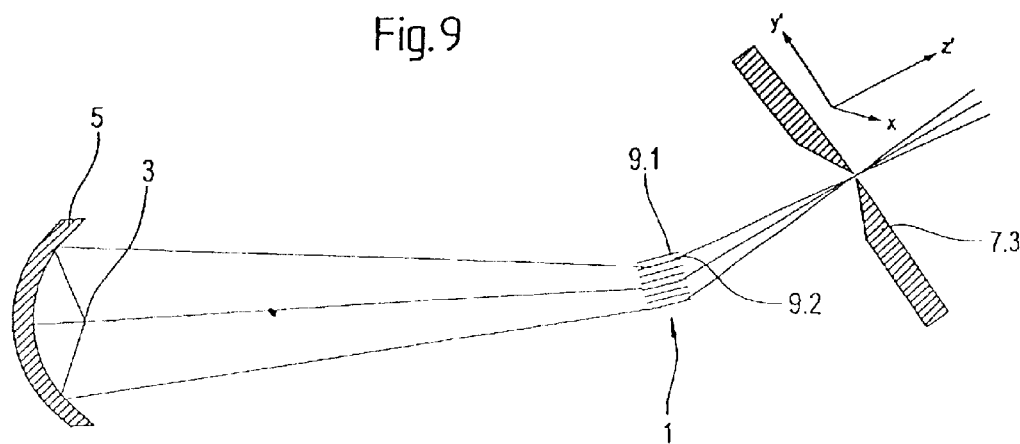

As an alternative to an arrangement of individual gratings 9 in a plane or tilted next to each other, they can also be arranged one above the other. An arrangement of one above the other yields a grating spectral filter 1, as shown in FIG. 9. The individual gratings of the individual planes are designated 9.1 and 9.2. The same components as in the embodiment according to FIG. 1 are given the same reference numbers. The gratings arranged one above the other can have a different grating period or can be tilted relative to each other.

In order to obtain a grating element 1 with optimal diffraction efficiency, each individual grating of the grating element is preferably designed as a Blaze grating.

Figure 8:
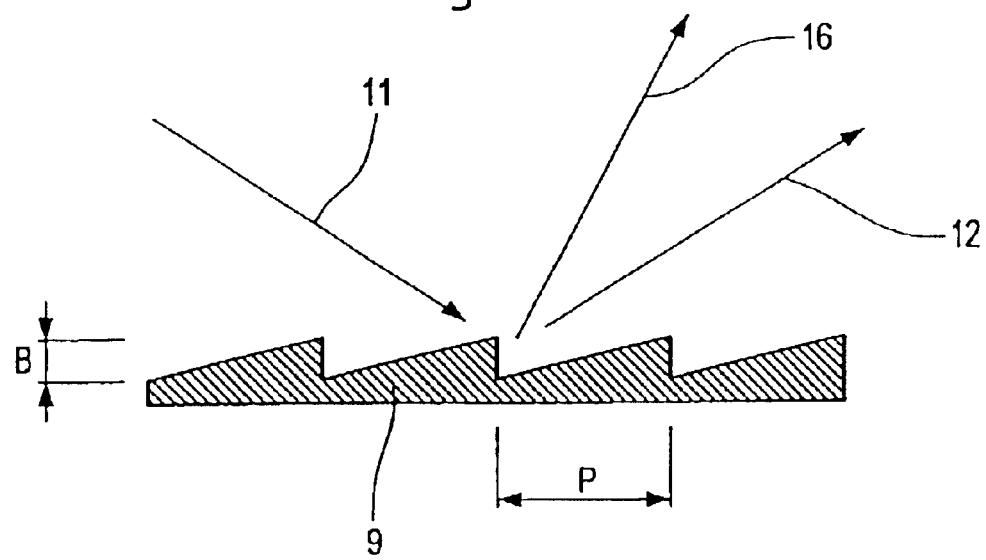

FIG. 8 shows a Blaze grating with approximately triangular groove profile. Reference 11 designates a ray impinging on grating 9, designed as a Blaze grating, with a grating period P; 12 designates a ray reflected on the grating 9 in the $0^{th}$ order and 16 designates a ray diffracted in the −1 order. Since the Blaze depth according to equation (8) is dependent on an angle of incidence of the beams impinging onto the grating 9, in an ideal case, each individual grating 9 of the grating element will have a different Blaze depth B.

Figure 10:
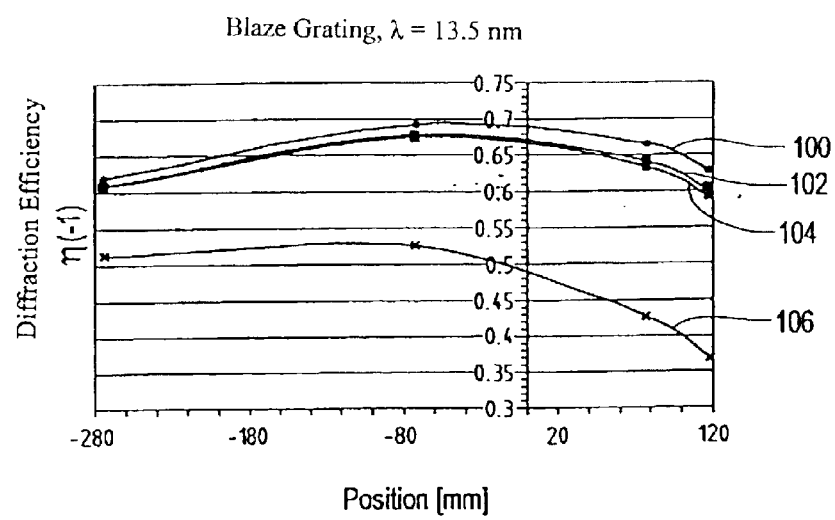

If one uses grating elements 1 whose local Blaze angle and, thus, grating depth as indicated in equation (8) changes with the position on the grating, one obtains a maximum efficiency according to FIG. 10, since the diffraction efficiency in the −1 order $\eta(-1)$ is a function of the Blaze depth. As FIG. 10 shows, the diffraction efficiency $\eta(-1)$ also depends on the materials used.

In FIG. 10, reference number 100 designates the diffraction efficiency $\eta(-1)$ for a wavelength of λ=13.5 nm for ruthenium; reference number 102 is for palladium; reference number 104 is for rhodium; and reference number 106 is for gold.

As follows from FIG. 10, a highest efficiency of 0.7 is achieved with ruthenium. A coating of palladium or rhodium, which has better long-term properties, only has an efficiency $\eta(-1)$ of 0.67, which is only around 3% poorer. Gold is conventionally used for synchrotron gratings, but as curve 106 reveals, it has a much poorer efficiency than the mentioned materials at λ=13.5 nm.

To simplify fabrication, all individual gratings can be produced with the same Blaze depth of, for example, 25 nm, and even so a diffraction efficiency $\eta(-1)$ of >55% or 0.55 is achieved.

Figure 11:
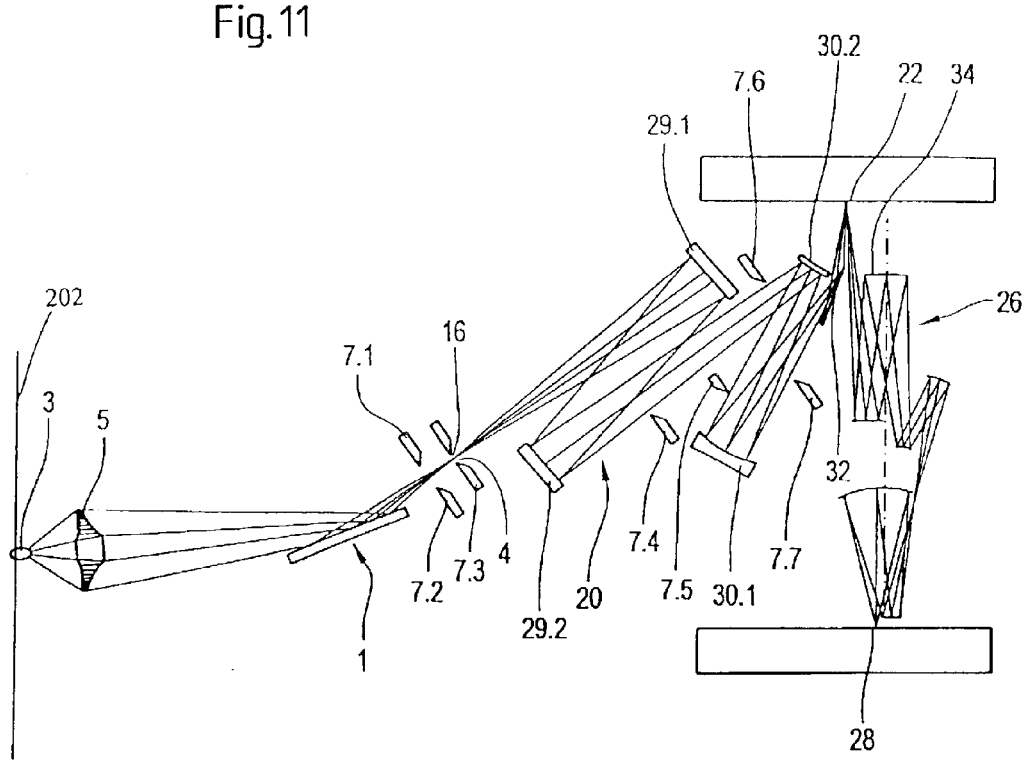

FIG. 11 shows an EUV projection exposure system with a grating element 1 according to the invention. The EUV projection exposure system comprises a light source 3, and a collecting optical component or so-called collector 5, which is configured as a nested collector according to the German patent application DE-A-10102934, submitted on Jan. 23, 2001 to the German Patent Office for the Applicant, whose disclosure content is also included in its entirety in the present application. Collector 5 images light source 3, which lies in an object plane 202 of an illumination system, in a secondary light source 4 in or near the diaphragm plane of diaphragm 7.3. In this embodiment the illumination system for illuminating an arc shaped field in the field plane 22 comprises light source 3, grating element 1, diaphragms 7.1, 7.2, 7.4, 7.5, 7.6 and 7.7 as well as diaphragm 7.3, and as further optical elements, facetted mirrors 29.1, 29.2, and mirrors 30.1, 30.2 and 32.

In the present case, light source 3, also referred to as a primary light source, which can be, for example, a laser plasma source or a plasma discharge source, is arranged in the object plane 202 of the illumination system; an image of light source 3, which is also termed a secondary light source 4, comes to lie in an image plane of the illumination system.

Between grating element 1 and diaphragm 7.3 are arranged additional diaphragms 7.1, 7.2, in order to block out the light of unwanted wavelengths, especially wavelengths greater than 30 nm. According to the invention, the focus of the −1 order will come to lie in the diaphragm plane of diaphragm 7.3, i.e., light source 3 is imaged by collector 5 and grating element 1, which functions as a grating spectral filter in the −1 diffraction order almost stigmatically in the diaphragm plane of diaphragm 7.3. Imaging in all other diffraction orders is not stigmatic.

Furthermore, the illumination system of the projection system comprises an optical system 20 to form and illuminate a field plane 22 with an annular field. The optical system 20 comprises, as a mixing unit for homogeneous illumination of the annular field, two facet mirrors 29.1, 29.2, as well as two imaging mirrors 30.1, 30.2 and a field-forming grazing-incidence mirror 32. Additional diaphragms 7.4, 7.5, 7.6, 7.7 are arranged in optical system 20 to suppress stray light.

The first facet mirror 29.1, so-called field facet mirror, generates a plurality of secondary light sources in or near a plane of the second facet mirror 29.2, so-called pupil facet mirror. The optical elements 30.2, 30.1, 32 following this images the pupil facet mirror 29.2 in an exit pupil 34 of the illumination system, which comes to lie in an entrance pupil of a projection objective 26. Angles of inclination of the individual facets of the first and second facet mirrors 29.1, 29.2 are designed so that images of the individual field facets of the first facet mirror 29.1 are superimposed in a field plane 22 of the illumination system and thus a largely homogenized illuminating of a pattern-bearing mask, which comes to lie in field plane 22, is achieved. A segment of the annular field is formed by field-forming grazing-incidence mirror 32 operating under grazing incidence.

A double-faceted illumination system is disclosed, for example, in the U.S. Pat. No. 6,198,793, and imaging and field-forming components are disclosed in PCT/EP/00/07258. The disclosure contents of these publications are fully incorporated in the present application.

The pattern-bearing mask arranged in the field plane 22, also known as a reticle, is imaged by means of projection objective 26 in an image plane 28 of field plane 22. Projection objective 26 is a 6-mirror projection objective, such as is disclosed in the U.S. Application No. 60/255,214, submitted on Dec. 13, 2000 at the US Patent Office for the Applicant, or DE-A-10037870, whose disclosure content is fully incorporated in the present Application. An object being exposed, for example, a wafer, is arranged in image plane 28.

The invention indicates for the first time an illumination system with which it is possible to select unwanted wavelengths directly after the primary light source.

List of Reference Numbers

1 Grating element
3 Light source
4 Secondary light source
5 Collector
7.1, 7.2, 7.3
7.4, 7.5, 7.6
7.7 Diaphragms of the illumination system
8 Cooling device
9, 9.1,
9.2 Individual gratings
10.1,
10.2 Inlet and outlet of the cooling device
11 Incident beam
12 Beam diffracted in $0^{th}$ order
16 Beam diffracted in the −1 order
20 Optical system
22 Field plane
26 Projection objective
28 Image plane of the field plane
29.1,
29.2 Facet mirrors
30.1,
30.2 Imaging mirrors
32 Field-forming mirror
34 Exit pupil of the illumination system
100, 102,
104, 106 Diffraction efficiency η(−1) for various materials
200 diaphragm plane
202 object plane

What is claimed is:

1. An illumination system comprising:
a light source that emits light rays;
a grating element having a plurality of gratings; and
a diaphragm that is arranged after said grating element in a beam path from an object plane to a field plane,
wherein said light rays in said beam path after said diaphragm have a wavelength in a range of 7–26 nm.

2. The illumination system according to claim 1,
wherein said beam path impinges said grating element, and
wherein said plurality of gratings have a first grating arranged above a second grating with respect to a direction of said beam path.

3. The illumination system according to claim 2, wherein said first grating and said second grating are parallel to each other.

4. The illumination system according to claim 2, wherein said first grating and said second grating are at a tilt relative to each other.

5. The illumination system according to claim 1,
wherein said beam path impinges said grating element, and
wherein said plurality of gratings have a first grating arranged after a second grating with respect to a direction of said beam path.

6. The illumination system according to claim 5, wherein said first grating and said second grating are in a plane defined by said grating element.

7. The illumination system according to claim 5, wherein said first grating and said second grating are at a tilt relative to a plane defined by said grating element.

8. The illumination system according to claim 1, further comprising a cooling device on a side of said grating element facing away from an incident ray.

9. The illumination system according to claim 1, wherein said plurality of gratings comprise a flat grating.

10. The illumination system according to claim 1,
wherein said plurality of gratings have a first grating having a first grating period and a second grating having a second grating period, and
wherein said first grating period is different from said second grating period.

11. The illumination system according to claim 10,
wherein said first grating has a first mean angle of incidence of rays impinging thereon,
wherein said second grating has a second mean angle of incidence of said rays impinging thereon,
wherein said first mean angle of incidence is a larger angle than said second mean angle of incidence, and
wherein said first grating period is smaller than said second grating period.

12. The illumination system according to claim 1, wherein said plurality of gratings comprises a Blaze grating.

13. The illumination system according to claim 1, wherein said grating element has a surface material selected from the group consisting of ruthenium, palladium, rhodium, and gold.

14. The illumination system according to claim 1, further comprising a collector unit for generating a convergent light bundle, wherein said convergent light bundle impinges on said grating element.

15. The illumination system according to claim 14,
wherein said light bundle has a focus, and
wherein said focus of said light bundle of $n^{th}$ diffraction order of said grating element lies at or near said diaphragm, where $|n| \geq 1$.

16. The illumination system according to claim 1, further comprising a primary light source in said object plane, wherein said primary light source is imaged in a secondary light source at said diaphragm.

17. The illumination system according to claim 1, further comprising an optical component for forming and illuminating a field in said field plane.

18. The illumination system according to claim 17, wherein said optical component homogeneously illuminates said field.

19. The illumination system according to claim 17,
wherein said field is a segment of an annular field, and
wherein said optical component has a field-forming element.

20. The illumination system according to claim 1, further comprising an additional diaphragm in said beam path between said object plane and said field plane.

21. An illumination system comprising:
a light source that emits light rays having a wavelength of $\leq 100$ nm;
a grating element having a plurality of gratings; and
a diaphragm that is arranged after said grating element in a beam path from an object plane to a field plane, wherein said diaphragm admits said light rays of an $n^{th}$ diffraction order of said grating element, where $|n| \geq 1$, and substantially blocks all said light rays of an $m^{th}$ diffraction order by more than 90%, where m≠n.

22. The illumination system according to claim 21,
wherein said beam path impinges said grating element, and
wherein said plurality of gratings have a first grating arranged above a second grating with respect to a direction of said beam path.

23. The illumination system according to claim 22, wherein said first grating and said second grating are parallel to each other.

24. The illumination system according to claim 22, wherein said first grating and said second grating are at a tilt relative to each other.

25. The illumination system according to claim 21,
wherein said beam path impinges said grating element, and
wherein said plurality of gratings have a first grating arranged after a second grating with respect to a direction of said beam path.

26. The illumination system according to claim 25, wherein said first grating and said second grating are in a plane defined by said grating element.

27. The illumination system according to claim 25, wherein said first grating and said second grating are at a tilt relative to a plane defined by said grating element.

28. The illumination system according to claim 21, further comprising a cooling device on a side of said grating element facing away from an incident ray.

29. The illumination system according to claim 21, wherein said plurality of gratings comprise a flat grating.

30. The illumination system according to claim 21,
wherein said plurality of gratings have a first grating having a first grating period and a second grating having a second grating period, and
wherein said first grating period is different from said second grating period.

31. The illumination system according to claim 30,
wherein said first grating has a first mean angle of incidence of rays impinging thereon,
wherein said second grating has a second mean angle of incidence of said rays impinging thereon,
wherein said first mean angle of incidence is a larger angle than said second mean angle of incidence, and
wherein said first grating period is smaller than said second grating period.

32. The illumination system according to claim 21, wherein said plurality of gratings comprises a Blaze grating.

33. The illumination system according to claim 21, wherein said grating element has a surface material selected from the group consisting of ruthenium, palladium, rhodium, and gold.

34. The illumination system according to claim 21, further comprising a collector unit for generating a convergent light bundle, wherein said convergent light bundle impinges on said grating element.

35. The illumination system according to claim 34,
wherein said light bundle has a focus, and
wherein said focus of said light bundle of an $n^{th}$ diffraction order of said grating element lies at or near said diaphragm, where $|n| \geq 1$.

36. The illumination system according to claim 21, further comprising a primary light source in said object plane, wherein said primary light source is imaged in a secondary light source at said diaphragm.

37. The illumination system according to claim 21, further comprising an optical component for forming and illuminating a field in said field plane.

38. The illumination system according to claim 37, wherein said optical component homogeneously illuminates said field.

39. The illumination system according to claim 37,
wherein said field is a segment of an annular field, and
wherein said optical component has a field-forming element.

40. The illumination system according to claim 21, further comprising an additional diaphragm in said beam path between said object plane and said field plane.

41. A projection exposure system for the production of a microelectronic component, comprising:
an illumination system having:
(a) a light source that emits radiation;
(b) a grating element having a plurality of gratings; and
(c) a diaphragm that is arranged downstream of said grating element in a light path from said light source to a field plane, wherein said radiation in said light path downstream of said diaphragm has a wavelength in a range from about 7 to 26 nm; and
a projection objective,
wherein said illumination system illuminates a pattern-bearing mask situated in a field of said field plane, and
wherein said projection objective images said pattern-bearing mask onto a light sensitive object.

42. A method for production of a microelectronic component, comprising:
employing a projection exposure system having:
an illumination system having:
(a) a light source that emits radiation;
(b) a grating element having a plurality of gratings; and
(c) a diaphragm that is arranged downstream of said grating element in a light path from said light source to a field plane, wherein said radiation in said light path downstream of said diaphragm has a wavelength in a range from about 7 to 26 nm; and
a projection objective,
wherein said illumination system illuminates a pattern-bearing mask situated in a field of said field plane, and
wherein said projection objective images said pattern-bearing mask onto a light sensitive object.

43. An illumination system comprising:
a light source that emits radiation;
a grating element having a plurality of gratings; and
a diaphragm that is arranged downstream of said grating element in a light path from said light source to a field plane,
wherein said radiation in said light path downstream of said diaphragm has a wavelength in a range of about 7 nm to about 26 nm.

44. An illumination system comprising:
a light source that emits radiation;
a grating element having a plurality of gratings; and
a diaphragm that is arranged downstream of said grating element in a light path from said light source to a field plane, wherein said diaphragm admits radiation wavelengths ≦100 nm that are of an $n^{th}$ diffraction order of said grating element, where $|n| \geq 1$, and substantially blocks all radiation of an $m^{th}$ diffraction order by more than about 90%, where m≠n.

45. A projection exposure system for the production of a microelectronic component, comprising:

an illumination system having:
  (a) a light source that emits radiation;
  (b) a grating element having a plurality of gratings; and
  (c) a diaphragm that is arranged downstream of said grating element in a light path from said light source to a field plane, wherein said diaphragm wavelengths ≦100 nm that are of an $n^{th}$ diffraction order of said grating element, where $|n| \geq 1$, and substantially blocks all said radiation of an $m^{th}$ diffraction order by more than 90%, where m≠n; and a projection objective, wherein said illumination system illuminates a pattern-bearing mask situated in said field plane, and wherein said projection objective images said pattern-bearing mask onto a light sensitive object.

46. A method for production of a microelectronic component, comprising:

employing a projection exposure that has:
  an illumination system having:
    (a) a light source that emits radiation;
    (b) a grating element having a plurality of gratings; and
    (c) a diaphragm that is arranged downstream of said grating element in a light path from said light source to a field plane, wherein said diaphragm admits radiation wavelengths ≦100 nm that are of an $n^{th}$ diffraction order of said grating element, where $|n| \geq 1$, and substantially blocks all radiation of an $m^{th}$ diffraction order by more than 90%, where m≠n; and
  a projection objective,
  wherein said illumination system illuminates a pattern-bearing mask situated in said field plane, and
  wherein said projection objective images said pattern-bearing mask onto a light sensitive object.

\* \* \* \* \*